US006950779B2

(12) United States Patent
Minatani

(10) Patent No.: US 6,950,779 B2
(45) Date of Patent: Sep. 27, 2005

(54) APPARATUS AND METHOD FOR DETECTING INCORRECT CONNECTOR INSERTION, AND PROGRAM FOR CARRYING OUT THE METHOD

(75) Inventor: Yoshihiko Minatani, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 233 days.

(21) Appl. No.: 10/375,132

(22) Filed: Feb. 28, 2003

(65) Prior Publication Data

US 2004/0243348 A1 Dec. 2, 2004

(30) Foreign Application Priority Data

Feb. 28, 2002  (JP) ...................................... 2002-052614

(51) Int. Cl.[7] .............................................. G06F 15/00
(52) U.S. Cl. ..................... 702/182; 702/57; 702/108; 702/182; 361/640; 439/43; 439/152; 307/38; 307/125; 324/538
(58) Field of Search .......................... 702/57, 107–108, 702/150, 182; 361/640, 357.2; 439/43, 152; 307/38, 125; 324/538

(56) References Cited

U.S. PATENT DOCUMENTS

| 4,015,200 A | * | 3/1977 | Strandh ...................... 324/540 |
| 4,130,794 A | * | 12/1978 | Cox ........................... 324/538 |
| 4,620,282 A | * | 10/1986 | Shelley ........................... 716/4 |
| 4,631,698 A | * | 12/1986 | Walsh et al. ................. 710/105 |
| 4,968,929 A | * | 11/1990 | Hauck et al. .................. 324/66 |
| 5,787,307 A | * | 7/1998 | Imoto ........................... 710/16 |
| 5,818,123 A | * | 10/1998 | Iwasaki et al. ............... 307/42 |
| 5,987,260 A | * | 11/1999 | Arnold et al. ................ 710/74 |
| 6,615,147 B1 | * | 9/2003 | Jonker et al. ................. 702/61 |
| 2002/0070857 A1 | * | 6/2002 | Brooks et al. .............. 340/540 |

OTHER PUBLICATIONS

Kuramato et al., 'Inverter Miniaturizing Technologies for EV/HEV Applications', 2001, IEEE Article, pp. 261–265.*

* cited by examiner

*Primary Examiner*—Marc S. Hoff
*Assistant Examiner*—Elias Desta
(74) *Attorney, Agent, or Firm*—Oliff & Berridge, PLC

(57) ABSTRACT

An apparatus for detecting incorrect connector insertion. The apparatus includes a first member including a first connector; a second member including a second connector; a test signal output processing unit that outputs a first test signal to the first member and the second member; a first determination signal outputting portion that outputs a first determination signal in accordance with outputting the first test signal to the first member; and a second determination signal outputting portion that outputs a second determination signal in accordance with outputting the first test signal to the second member. The apparatus further includes a connector-connected state determination processing unit that determines the connected state of the first connector and the second connector based on the first determination signal and the second determination signal.

18 Claims, 6 Drawing Sheets

APPARATUS AND METHOD FOR DETECTING INCORRECT CONNECTOR INSERTION, AND PROGRAM FOR CARRYING OUT THE METHOD

INCORPORATED BY REFERENCE

The disclosure of Japanese Patent Application No. 2002-052614 filed on Feb. 28, 2002 including the specification, drawings and abstract are incorporated herein by reference in its entirety.

BACKGROUND OF THE INVENTION

1. Field of Invention

The invention relates to an apparatus and method for detecting incorrect connector insertion, and a program for carrying out the method.

2. Description of Related Art

Conventionally, an electrically driven vehicle, for example, a hybrid vehicle, is equipped with an electrically-driven vehicle drive apparatus for running the hybrid vehicle. In the electrically-driven vehicle drive apparatus, torque generated by a drive motor serving as a first electric power machine, that is, drive motor torque, is transmitted to a drive wheel so as to run the hybrid vehicle. In addition, torque generated by the drive of an engine, i.e., engine torque, is transmitted either to the drive wheel to run the hybrid vehicle, or to a generator serving as a second electric power machine so as to generate electric power.

The drive motor has a rotor that is equipped with a paired magnetic poles, and a stator provided around the rotor in the radial direction and that is equipped with three U-, V- and W-phase coils. The supply of U-, V- and W-phase currents to the coils drives the drive motor and enables the generation of the drive motor torque.

Further, a battery is connected to a first inverter used for the drive motor and a direct current is supplied from the battery to the first inverter. Based on a pulse width modulation signal generated by a drive motor control device, a plurality of transistors in the first inverter are turned on and off in a predetermined pattern, thus generating each phase of the currents. A first power supply circuit portion is used to generate the necessary voltage for turning each transistor on and off. The first power supply circuit portion is connected to the first inverter, and U-, V- and W-phase voltage generated in the first power supply circuit portion is supplied to the first inverter.

The generator has a rotor that is equipped with paired magnetic poles, and a stator provided around the rotor in the radial direction that is also equipped with U-, V- and W-phase coils. When the engine torque is transmitted to the rotor, it drives the generator and U-, V- and W-phase currents are produced in the coils for electric power generation.

The battery, which is connected to a second inverter, is used for the generator. Based on a pulse width modulation signal generated by a generator control device, a plurality of transistors in the second inverter are turned on and off in a predetermined pattern, thus generating a direct current which is then supplied to the battery. A second power supply circuit portion is used to generate the necessary voltage for turning each transistor on and off. The second power supply circuit portion is connected to the second inverter, and U-, V- and W-phase voltage generated in the second power supply circuit portion is supplied to the second inverter.

FIG. 2 is a diagram illustrating an essential part of a conventional electrically-driven vehicle drive apparatus.

In FIG. 2, reference numeral 31 denotes a power supply apparatus including a power supply board. Reference numeral 32 denotes a first IPM (intelligent power module) equipped with a first inverter (not shown) and a drive circuit (not shown) for driving a drive motor (not shown). Reference numeral 33 denotes a second IPM equipped with a second inverter (not shown) and a drive circuit (not shown) for driving a generator (not shown). Reference numeral 34 denotes a control device portion. The power supply apparatus 31 is equipped with a first power supply circuit portion 35 used for the drive motor and provided for generating the voltage required to turn on and off a plurality of transistors forming the first inverter. The power supply apparatus 31 is further equipped with a second power supply circuit portion 36 used for the generator and provided for generating the voltage required to turn on and off a plurality of transistors forming the second inverter. The second power supply circuit portion 36 is made to the same specifications as those in the first power supply circuit portion 35. The first and second power supply circuit portions 35 and 36 are formed in one piece, however, they may be formed separately. The control device portion 34 is equipped with a drive motor control device 37 serving as a first control device to control the drive motor, and a generator control device 38 serving as a second control device to control the generator. The drive motor control device 37 and the generator control device 38 are formed in one piece, however, they may be formed separately.

Connectors C1 and C2 are provided in the first power supply circuit portion 35; connectors C3 and C4 are provided in the first IPM 32; connectors C5 and C6 are provided in the drive motor control device 37; connectors C11 and C12 are provided in the second power supply circuit portion 36; connectors C13 and C14 are provided in the second IPM 33; and connectors C15 and C16 are provided in the generator control device 38. Cables CB1 to CB3 and CB11 to CB13 connect between the connectors C1 and C3, the connectors C2 and C5, the connectors C4 and C6, the connectors C11 and C13, the connectors C12 and C15 and the connectors C14 and C16. Each of the connectors C1 to C6 and C11 to C16 is equipped with a first connecting terminal portion mounted on the corresponding one of the cables CB1 to CB3 and CB11 to CB13, and a second connecting terminal portion mounted on the corresponding one of the first and second power supply circuit portions 35 and 36, the first and second IPMs 32 and 33, the drive motor control device 37 and the generator control device 38, so that the connector establishes electrical interruption by means of connection/disconnection between the first and second connecting terminals.

The connector C1 is equipped with an output terminal (not shown) used to output the necessary voltage to drive the first inverter. The connector C2 is equipped with an input terminal (not shown) to receive ignition (IG) voltage supplied from the drive motor control device 37, an output terminal (not shown) used to output a Ready signal, and a ground terminal (not shown) for grounding the first power supply circuit portion 35.

Further, the connector C3 is equipped with an input terminal (not shown) that receives the voltage supplied from the first power supply circuit portion 35. The connector C4 is equipped with an input terminal (not shown) used to receive ignition voltage supplied from the drive motor control device 37, an input terminal (not shown) used to receive a pulse width modulation signal for switching each of the transistors forming the first inverter, an output terminal (not shown) used to output a Ready signal, and a ground terminal (not shown) for grounding the first IPM 32.

The connector C5 is equipped with an input terminal (not shown) that receives the Ready signal provided by the first power supply circuit portion 35, and an output terminal (not shown) for outputting the ignition voltage. The connector C6 is equipped with an input terminal (not shown) that receives the Ready signal sent from the first IPM 32, an output terminal (not shown) for outputting the ignition voltage, an output terminal (not shown) for outputting the pulse width modulation signal, and a ground terminal (not shown) for grounding the drive motor control device 37.

Likewise, the connector C11 is equipped with an output terminal (not shown) used to output the necessary voltage for driving the second inverter. The connector C12 is equipped with an input terminal (not shown) for receiving ignition voltage supplied from the generator control device 38, an output terminal (not shown) used to output a Ready signal, and a ground terminal (not shown) for grounding the second power supply circuit portion 36.

The connector C13 is equipped with an input terminal (not shown) for receiving the voltage supplied from the second power supply circuit portion 36. The connector C14 is equipped with an input terminal (not shown) used to receive ignition voltage supplied from the generator control device 38, an input terminal (not shown) used to receive a pulse width modulation signal for switching each of the transistors forming the second inverter, an output terminal (not shown) used to output a Ready signal, and a ground terminal (not shown) for grounding the second IPM 33.

The connector C15 is equipped with an input terminal (not shown) for receiving the Ready signal sent from the second power supply circuit portion 36, and an output terminal (not shown) for outputting the ignition voltage. The connector C16 is equipped with an input terminal (not shown) for receiving the Ready signal sent from the second IPM 33, an output terminal (not shown) for outputting the ignition voltage, an output terminal (not shown) for outputting the pulse width modulation signal, and a ground terminal (not shown) for grounding the generator control device 38.

The Ready signal is a signal indicating that the first and second power supply circuit portions 35 and 36, the first and second IPMs 32 and 33 are operating normally, and the voltage necessary for driving the first or second inverter that is received from the first or second power supply circuit portion 35 or 36 is normal, not excessively high or low. By referring to the logic (level) of the Ready signal, it is possible to determine whether the first and second power supply circuit portions 35 and 36, the first and second IPM 32 and 33 are operating normally, i.e. whether abnormalities have occurred in the first and second power supply circuit portions 35 and 36, the first and second IPM 32 and 33. The logic of the Ready signal is active at high level during normal operation so as to allow detection of abnormalities that occurred when a ground short-circuits, since a ground short circuit is an abnormality that is likely to occur in the first and second power supply circuit portions 35 and 36, the first and second IPMs 32 and 33.

A failure may occur in one of the first control circuit constituted of the first power supply circuit portion 35, the first IPM 32 and the drive motor control device 37, and a second control circuit constituted of the second power supply circuit portion 36, the second IPM 33 and the generator control device 38. In this case, in the control circuit in which the failure occurs, a fail determination processing unit (not shown) of the drive motor control device 37 or generation control device 38 carries out a fail determination process, stops the outputting of ignition voltage, and actuates the other control circuit in which no failure occurs, for the control.

SUMMARY OF THE INVENTION

However, the conventional electrically-driven vehicle drive apparatus needs a connection among the first power supply circuit portion 35 and the first IPM 32 and the drive motor control device 37, and a connection among the second power supply circuit portion 36 and the second IPM 33 and the generator control device 38. This may result in the incorrect insertion between the connector C1 and the connector C11, between the connector C2 and the connector C12, between the connector C3 and the connector C13, between the connector C4 and the connector C14, between the connector C5 and the connector C15, and between the connector C6 and the connector C16.

In particular, when the first and second power supply circuit portions 35 and 36 are formed in one piece as described above, the connectors C1, C2, C11 and C12 are located close to one another, thus increasing the likelihood of producing the incorrect connector insertion. Further, as described above, when the first and second power supply circuit portions 35 and 36 are made to the same specifications, the specifications of the connectors C1 and C2 are also the same as those of the connectors C11 and C12, thus further increasing the likelihood of producing the incorrect connector insertion.

As a result, it is very difficult or almost impossible to detect any abnormality when it occurs in the first or second control circuit, for example.

Some possible ways of preventing improper connector insertion include changing the shape for connectors C1 to C6 and C11 to C16 so as to disable insertion/removal between the first and second connecting terminal portions of two connectors for prevention of the incorrect connector insertion. Alternatively, connectors C1 to C6 and C11 to C16 may be marked or colored in various designs or colors so as to enable the operator to more easily distinguish between the connectors C1 to C6 and C11 to C16 to prevent the incorrect connector insertion. These modifications, however, require the high cost of the connectors C1 to C6 and C11 to C16, leading to an increase in the cost of the electrically-driven vehicle drive apparatus.

It is an object of the invention to solve the problems of the aforementioned conventional electrically-driven vehicle drive apparatus, and provide an apparatus and method for detecting incorrect connector insertion, and a program for carrying out the method, which are capable of detecting incorrect insertion of connectors and reducing the costs of an electrically-driven vehicle drive apparatus.

An apparatus for detecting incorrect connector insertion according to a first aspect of the invention, includes: a first member having a first connector; a second member having a second connector; a test signal output processing unit for outputting a first test signal to the first member and to the second member; a first determination signal outputting portion for outputting a first determination signal in accordance with outputting of the first test signal to the first member; a second determination signal outputting portion for outputting a second determination signal in accordance with outputting of the first test signal to the second member; and a connector-connected-state determination processing unit for determining the connected state of the first connector and the second connector based on the first determination signal and the second determination signal.

The first aspect enables the determination of the connected states of the first and second connectors based on the first and second determination signals, resulting in the achievement of detection of incorrect connector insertion.

Further, the first aspect eliminates the need of creating differences in shape or color for the first connector and the second connector so that costs of the first and second connectors are reduced, resulting in the cost reduction of an electrically-driven vehicle drive apparatus.

The apparatus for detecting the incorrect connector insertion according to the first aspect may be structured such that the connector-connected-state determination processing unit selectively outputs a second test signal to the first and second determination signal outputting portions. The first determination signal is output in accordance with the outputting of the first test signal to the first member and the second test signal to the first determination signal outputting portion. The second determination signal is output in accordance with the outputting of the first test signal to the second member and the second test signal to the second determination signal outputting portion.

The apparatus for detecting the incorrect connector insertion according to the first aspect may be structured such that the connector-connected-state determination processing unit determines that incorrect connector insertion has occurred if the first and second determination signals become active when the test signals are output to the first and second determination signal outputting portions, and if a predetermined determination signal does not become active when the test signal is output to one of the first and second determination signal outputting portions.

The apparatus for detecting the incorrect connector insertion according to the first aspect may be structured such that the first member outputs a first output signal to the first determination signal outputting portion in accordance with the outputting of the first test signal to the first member, and the first determination signal outputting portion outputs the first determination signal in accordance with the outputting of the first output signal, and similarly the second member outputs a second output signal to the second determination signal outputting portion in accordance with the outputting of the second test signal to the second member, and the second determination signal outputting portion outputs the second determination signal in accordance with the outputting of the second output signal.

The apparatus for detecting the incorrect connector insertion according to the first aspect may be structured such that the first and second determination signal outputting portions respectively receive test signals output from the test signal output processing unit, and respectively output the first and second determination signals.

The apparatus for detecting the incorrect connector insertion according to the first aspect may be structured such that the test signal output processing unit and the connector-connected state determination processing unit are provided in a third member.

The apparatus for detecting the incorrect connector insertion according to the first aspect may be structured such that the first test signal is an ignition voltage.

The apparatus for detecting the incorrect connector insertion according to the first aspect may be structured such that the first member is a first power supply circuit portion, and the second member is a second power supply circuit portion. The first determination signal outputting portion is a first IPM, and the second determination signal outputting portion is a second IPM. In addition, the first output signal is a voltage required to drive the first IPM, and the second output signal is a voltage required to drive the second IPM.

The apparatus for detecting the incorrect connector insertion according to the first aspect may be structured such that the first determination signal outputting portion is provided in the first member, and the second determination signal outputting portion is provided in the second member.

According to a second aspect of the invention, a method for detecting incorrect connector insertion includes the steps of: outputting test signals to a first member including a first connector, and to a second member including a second connector; and determining a connected state of the first connector on the basis of a first determination signal output from a first determination signal outputting portion in accordance with the outputting of the test signal to the first member, and a connected state of the second connector on the basis of a second determination signal output from a second determination signal outputting portion in accordance with the outputting of the test signal to the second member.

According to a third aspect of the invention, a program for carrying out a method of detecting incorrect connector insertion, includes the step of making the computer function as a test signal output processing unit for outputting test signals to a first member including a first connector and a second member including a second connector, and as a connector-connected state determination processing unit for determining a connected state of the first connector on the basis of a first determination signal output from a first determination signal outputting portion in accordance with the outputting of the test signal to the first member, and a connected state of the second connector on the basis of a second determination signal output from a second determination signal outputting portion in accordance with the outputting of the test signal to the second member.

BRIEF DESCRIPTION OF THE DRAWINGS

The various exemplary embodiments of the invention will be described with reference to the following drawings, in which.

DETAILED DESCRIPTION OF PREFERRED EMBODIMENTS

An exemplary embodiment according to the invention will be described below in detail with reference to the accompanying drawings, in which a hybrid vehicle is described as an example of an electrically driven vehicle. However, the invention is applicable to an electric automobile which is the electrically driven vehicle.

Figure 1:
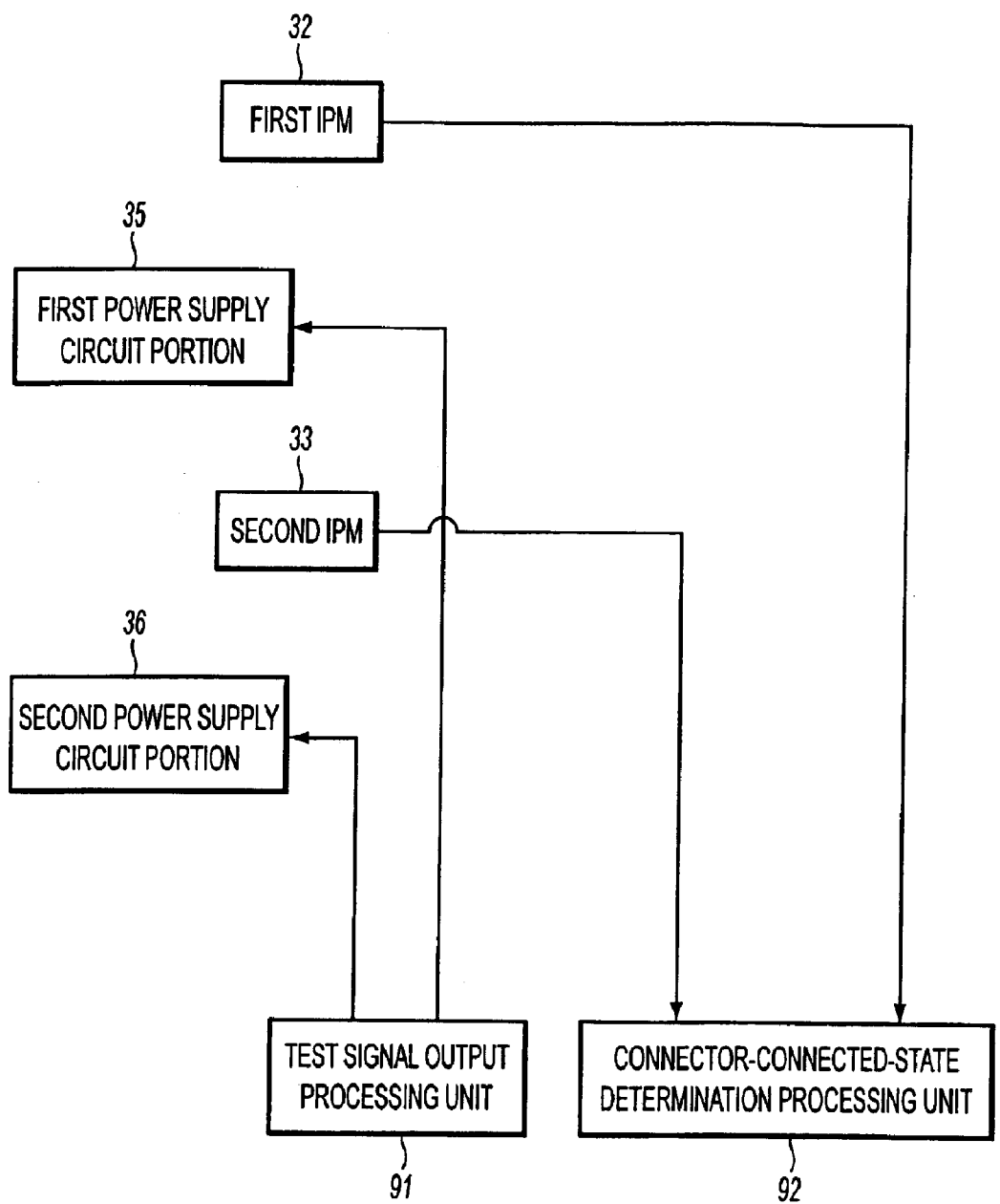
FIG. 1 is a block diagram illustrating the functions of an exemplary apparatus for detecting incorrect connector insertion according to an embodiment of the invention.
Figure 2:
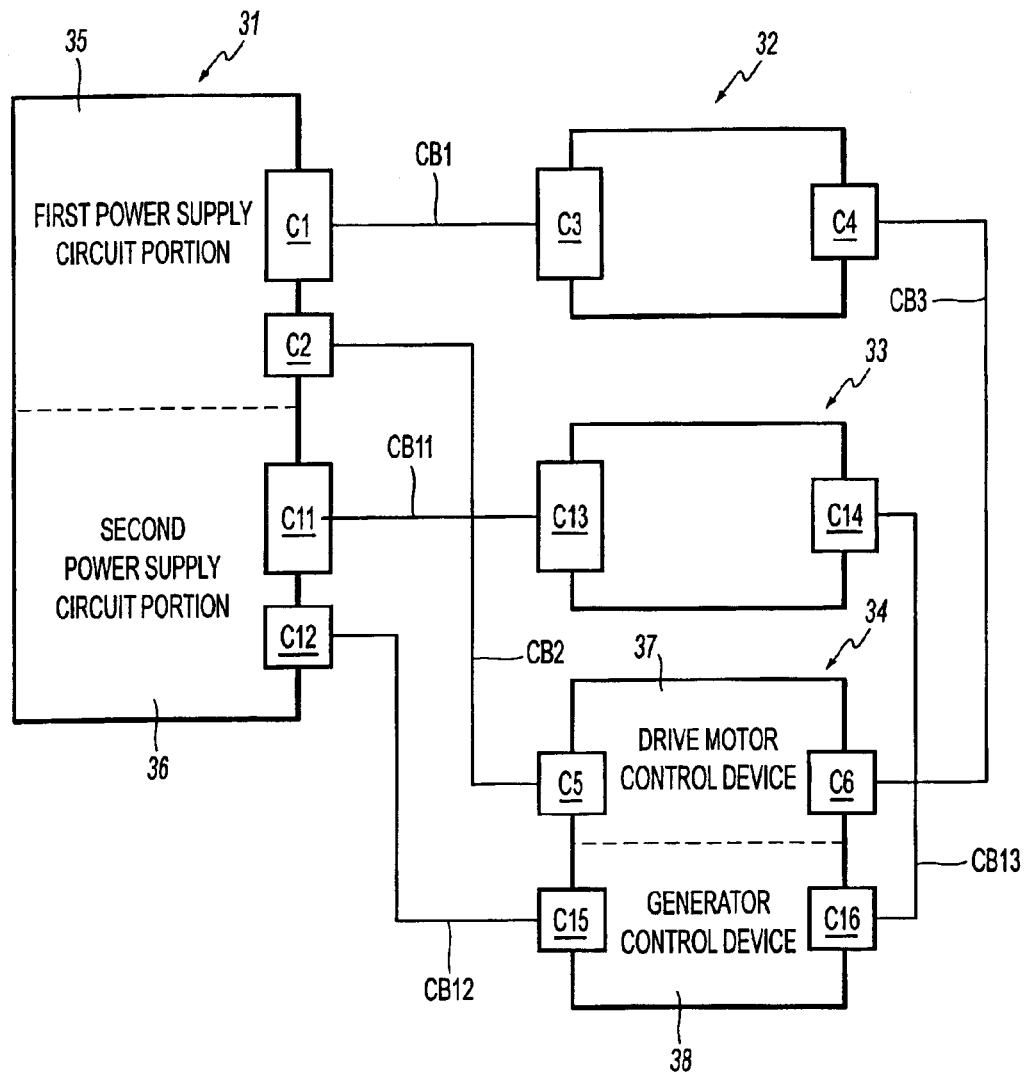
FIG. 2 is a diagram illustrating an essential part of an electrically-driven vehicle drive apparatus in the related art.

FIG. 1 is a block diagram of the functions of a detecting apparatus for detecting incorrect connector insertion according to the embodiment of the invention.

In FIG. 1, reference numeral 35 denotes a first power supply circuit portion intended for a drive motor (not shown) and serving as a first member provided with a first connector (not shown). Reference numeral 36 denotes a second power supply circuit portion intended for a generator (not shown) and serving as a second member provided with a second connector (not shown). Reference numeral 91 denotes a test signal output processing unit for outputting an ignition voltage as a first test signal to each of the first and second power supply circuit portions 35 and 36. Reference numeral 32 denotes a first IPM serving as a first determination signal outputting portion for outputting a first determination signal in accordance with the outputting of the ignition voltage, i.e., first test signal, to the first power supply circuit portion 35. Reference numeral 33 denotes a second IPM serving as a second determination signal outputting portion for outputting a second determination signal in accordance with the outputting of the ignition voltage, i.e., first test signal, to the second power supply circuit portion 36. Reference numeral 92 denotes a connector-connected state determination processing unit for determining the connected state of the first and second connectors based on the first and second determination signals.

Figure 3:
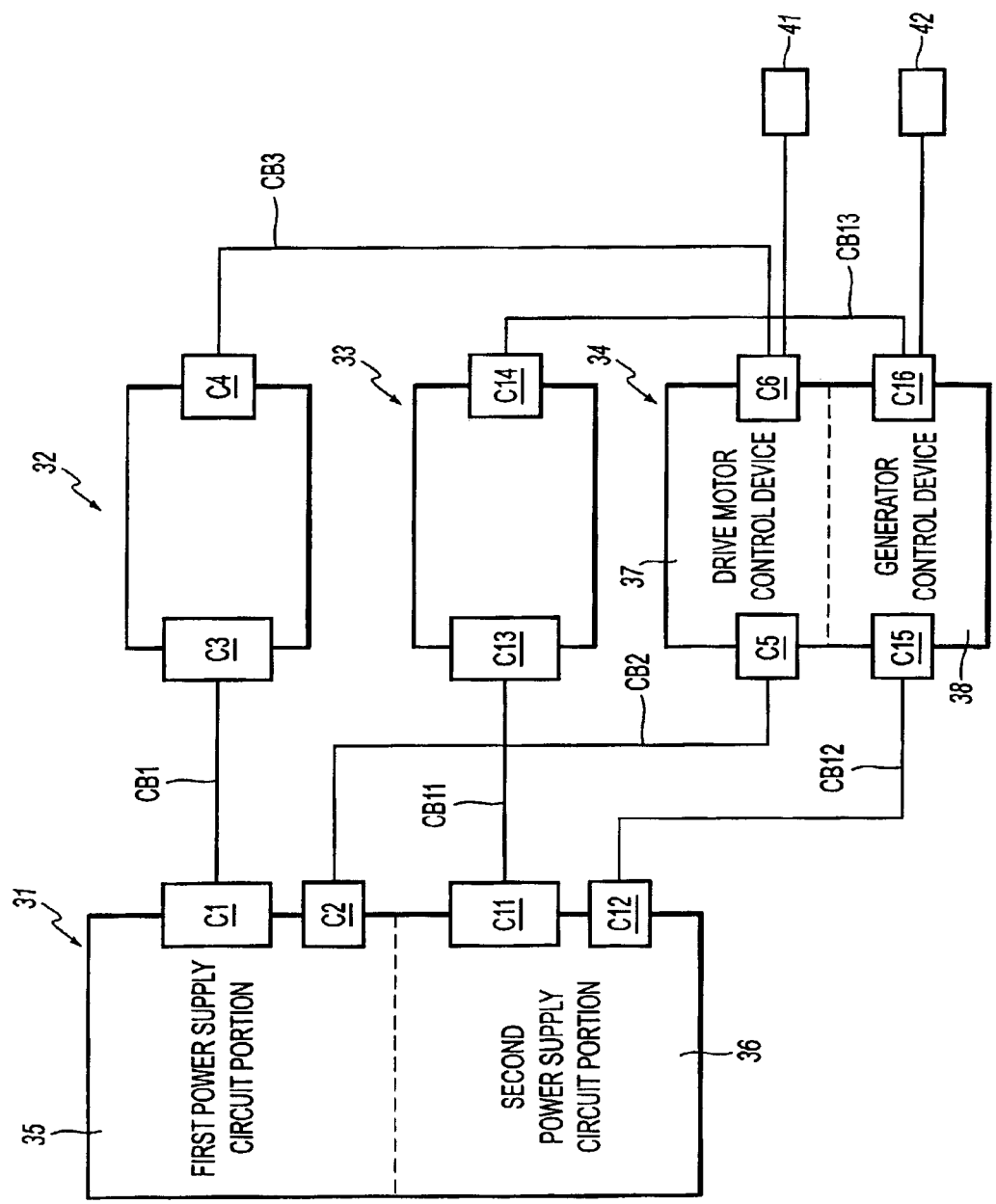
FIG. 3 is a diagram illustrating an essential part of an electrically-driven vehicle drive apparatus according to the exemplary embodiment of the invention.
Figure 4:
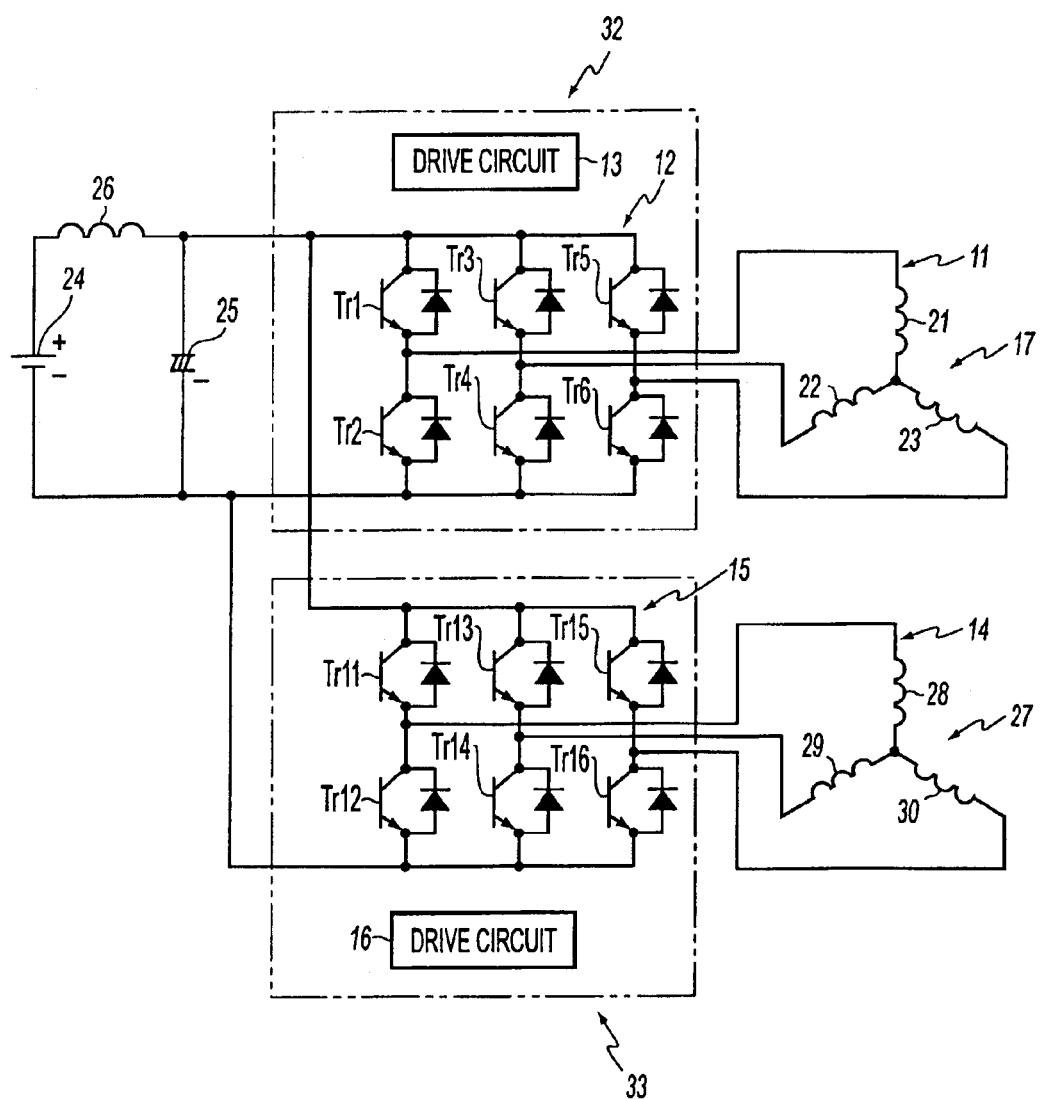
FIG. 4 is a diagram illustrating the operation of first and second IPMs according to the exemplary embodiment of the invention.

FIG. 3 is a diagram illustrating an essential part of an electrically-driven vehicle drive apparatus according to the embodiment of the invention. FIG. 4 is a diagram illustrating the operation of the first and second IPMs according to the embodiment of the invention.

In FIGS. 3 and 4, reference numeral 31 denotes power supply apparatus including a power supply board. Reference numeral 32 denotes the first IPM serving as the first determination signal outputting portion which is provided with a first inverter 12 and a drive circuit 13 for driving a drive motor 11 serving as a first electric power machine, and outputs a Ready signal serving as the first determination signal. Reference numeral 33 denotes the second IPM serving as the second determination signal outputting portion which is provided with a second inverter 15 and a drive circuit 16 for driving a generator 14 serving as a second electric power machine, and outputs a Ready signal serving as the second determination signal. Reference numeral 34 denotes a control device portion serving as a third member. The first and second IPMs 32 and 33 are made to the same specifications.

The power supply apparatus 31 includes: the first power supply circuit portion 35 intended for the drive motor 11, serving as the first member for generating the voltage required to cause the switching of a plurality of transistors Tr1 to Tr6 serving as switching elements and constituting the first inverter 12; and the second power supply circuit portion 36 intended for the generator 14, serving as the second member for generating the voltage required to cause the switching of a plurality of transistors Tr11 to Tr16 serving as switching elements and constituting the second inverter 15. The first and second power supply circuit portions 35 and 36 are made to the same specifications and formed in one piece, but may be formed separately.

The control device portion 34 includes a drive motor control device 37 serving as a first control device for controlling the drive motor 11, and a generator control device 38 serving as a second control device for controlling the generator 14. The drive motor control device 37 and the generator control device 38 are formed in one piece but may be formed separately. Each of the drive motor control device 37 and the generator control device 38 includes a CPU, a recorder and the like which are not shown, and functions as a computer in accordance with a variety of programs, data and the like.

The drive motor 11 has a rotor (not shown) and a stator 17 provided around the rotor in the radial direction. The rotor includes a rotor core mounted on a shaft (not shown) of the drive motor 11 and a plurality of permanent magnets arranged in a plurality of positions in the circumferential direction of the rotor core. The stator 17 includes a stator core (not shown) and U-, V-, and W-phase stator coils 21, 22 and 23 which are wound on the stator core.

A battery 24 serving as a DC power supply is provided for driving the drive motor 11 to run the hybrid vehicle, and connected to the first inverter 12 to supply a direct current to the first inverter 12. The first inverter 12 converts the direct current into an alternating current to generate currents Iu, Iv and Iw of phases U, V and W. The drive circuit 13 receives a pulse width modulation signal from the drive motor control device 37, and generates and sends a drive signal to the first inverter 12. The first inverter 12 generates the currents Iu, Iv and Iw which then are respectively supplied to the stator coils 21, 22 and 23.

For this purpose, the transistors Tr1 to Tr6 are selectively switched on and off in response to the drive signal generated by the drive circuit 13, thereby generating the currents Iu, Iv and Iw. In order to generate the voltage required to switch each of the transistors Tr1 to Tr6, the first inverter 12 is connected to the first power supply circuit portion 35, and supplied with voltages of phases U, V and W generated in the first power supply circuit portion 35.

A smoothing capacitor 25 is provided between the first IPM 32 and the battery 24. Charge corresponding to capacitance is accumulated in the capacitor 25. A coil 26 for eliminating noise is connected between the battery 24 and the capacitor 25.

The generator 14 has a rotor (not shown) and a stator 27 provided around the rotor in the radial direction. The rotor includes a rotor core mounted on a shaft (not shown) of the generator 14 and a plurality of permanent magnets arranged in positions in the circumferential direction of the rotor core. The stator 27 includes a stator core (not shown) and U-, V-, and W-phase stator coils 28, 29 and 30 which are wound on the stator core.

Engine torque generated by driving the engine (not shown) is transmitted to the rotor of the generator 14, whereupon the generator 14 is driven so that currents Iu, Iv and Iw of phases U, V and W are produced in the coils 28, 29 and 30, resulting in the generation of electric power. The resulting electric power is supplied to the battery 24.

For this purpose, the battery 24 is connected to the second inverter 15. A plurality of the transistors Tr11 to Tr16 forming the second inverter 15 are selectively switched on and off in response to the pulse width modulation signal generated by the generator control device 38, thereby generating the currents Iu, Iv and Iw which then are supplied to the battery 24. In order to generate the voltage required to switch each of the transistors Tr11 to Tr16, the second inverter 15 is connected to the second power supply circuit portion 36, and supplied with voltages of phases U, V and W generated in the second power supply circuit portion 36.

Connectors C1 and C2 serving as the first connector are provided in the first power supply circuit portion 35; connectors C3 and C4 are provided in the first IPM 32; connectors C5 and C6 are provided in the drive motor control device 37; connectors C11 and C12 serving as the second connector are provided in the second power supply circuit portion 36; connectors C13 and C14 are provided in the second IPM 33; and connectors C15 and C16 are provided in the generator control device 38. The connectors C1 and C3, the connectors C2 and C5, the connectors C4 and C6, the connectors C11 and C13, the connectors C12 and C15 and the connectors C14 and C16 are connected to each other by the corresponding cables CB1 to CB3 and CB11 to CB13. Each of the connectors C1 to C6 and C11 to C16 is provided with a first connecting terminal portion mounted on the corresponding one of the cables CB1 to CB3 and CB11 to CB13, and a second connecting terminal portion mounted on the corresponding one of the first and second power supply circuit portions 35 and 36, the first and second IPMs 32 and 33, the drive motor control device 37 and the generator control device 38, so that the connector establishes electrical interruption by means of the engagement/disengagement between the first and second connecting terminal portions.

The connector C1 is provided with an output terminal (not shown) used to output the necessary voltage for driving the first inverter 12 as a first output signal to the first IPM 32. The connector C2 is provided with an input terminal (not shown) for receiving ignition (IG) voltage which is sent as a first test signal from the drive motor control device 37, an output terminal (not shown) for outputting a Ready signal, and a ground terminal (not shown) for grounding the first power supply circuit portion 35.

Further, the connector C3 is provided with an input terminal (not shown) for receiving the voltage supplied as the first output signal from the first power supply circuit portion 35. The connector C4 is provided with an input terminal (not shown) for receiving ignition voltage sent as a second test signal from the drive motor control device 37, an input terminal (not shown) for receiving a pulse width modulation signal for switching each of the transistors Tr1 to Tr6 from the drive motor control device 37, an output terminal (not shown) for outputting a Ready signal as a first determination signal to the drive motor control device 37, and a ground terminal (not shown) for grounding the first IPM 32.

The connector C5 is provided with an input terminal (not shown) for receiving the Ready signal from the first power supply circuit portion 35, and an output terminal (not shown) for outputting the ignition voltage as the first test signal to the first power supply circuit portion 35. The connector C6 is provided with an input terminal (not shown) for receiving the Ready signal as the first determination signal from the first IPM 32, an output terminal (not shown) for outputting the ignition voltage as the second test signal to the first IPM 32, an output terminal (not shown) for outputting the pulse width modulation signal to the IPM 32, a ground terminal (not shown) for grounding the drive motor control device 37, and also an output terminal (not shown) for outputting a notice signal to a first indicating portion 41 serving as a first notice portion.

Likewise, the connector C1 is provided with an output terminal (not shown) for outputting the necessary voltage for driving the second inverter 15 as a second output signal to the second IPM 33. The connector C12 is provided with an input terminal (not shown) for receiving ignition voltage as a first test signal from the generator control device 38, an output terminal (not shown) for outputting a Ready signal, and a ground terminal (not shown) for grounding the second power supply circuit portion 36.

The connector C13 is provided with an input terminal (not shown) for receiving the voltage as the second output signal sent from the second power supply circuit portion 36. The connector C14 is provided with an input terminal (not shown) for receiving ignition voltage as a second test signal supplied from the generator control device 38, an input terminal (not shown) for receiving a pulse width modulation signal for switching each of the transistors Tr11 to Tr16 which is sent from the generator control device 38, an output terminal (not shown) for outputting a Ready signal as a second determination signal to the generator control device 38, and a ground terminal (not shown) for grounding the second IPM 33.

The connector C15 is provided with an input terminal (not shown) for receiving the Ready signal sent from the second power supply circuit portion 36, and an output terminal (not shown) for outputting the ignition voltage as the first test signal to the second power supply circuit portion 36. The connector C16 is provided with an input terminal (not shown) for receiving the Ready signal as the second determination signal sent from the second IPM 33, an output terminal (not shown) for outputting the ignition voltage as the second test signal to the second IPM 33, an output terminal (not shown) for outputting the pulse width modulation signal to the second IPM 33, a ground terminal (not shown) for grounding the generator control device 38, and an output terminal (not shown) for outputting a notice signal to a second indicating portion 42 serving as a second notice portion.

The first indicating portion 41 and the second indicating portion 42 can be structured by, for example, an indicating portion lamp or the like which is lit up when the notice signal is output, but alternatively may be structured by a display which shows a predetermined message when the notice signal is output. Alternatively, a voice output portion (not shown) may be used as each of the first and second notice portions to deliver a voice message to the operator.

The Ready signal represents that each of the connectors C1 to C6 and C11 and C16 is not mechanically disconnected, and that the first and second power supply circuit portions 35 and 36, the first and second IPMs 32 and 33 and the like are operating normally, and that the voltage necessary for driving the first or second inverter 12 or 15 that is received from the first or second power supply circuit portion 35 or 36 is normal, not excessively high or low. By simply referring to the logic (level) of the Ready signal, it is possible to determine whether or not abnormality occurs in each of the first and second power supply circuit portions 35 and 36, the first and second IPM 32 and 33 and the like. The logic of the Ready signal is active at high level during normal operation so as to allow detection of that occurred when a ground short-circuits, since a ground short circuit is an abnormality that is likely to occur in the first and second power supply circuit portions 35 and 36, the first and second IPMs 32 and 33 and the like.

If a failure occurs in one of a first control circuit constituted of the first power supply circuit portion 35, the first IPM 32 and the drive motor control device 37, and a second control circuit constituted of the second power supply circuit portion 36, the second IPM 33 and the generator control device 38, in the control circuit in which the failure occurs, a fail determination processing unit (not shown) of the drive motor control device 37 or generation control device 38 carries out a fail determination process, stops the outputting of the ignition voltage, and actuates the other control circuit, in which no failure has occurred, for the control.

However, the electrically-driven vehicle drive apparatus designed as described above needs a connection between the first power supply circuit portion 35 and the first IPM 32 and the drive motor control device 37, and a connection between the second power supply circuit portion 36 and the second IPM 33 and the generator control device 38. However, if incorrect connector insertion has occurred between the connector C1 and the connector C11, between the connector C2 and the connector C12, between the connector C3 and the connector C13, between the connector C4 and the connector C14, between the connector C5 and the connector C15, or between the connector C6 and the connector C16, it is impossible to detect abnormality when it occurs in the first or second control circuit, for example.

In particular, as described in the foregoing embodiment, when the first and second power supply circuit portions 35 and 36 are formed in one piece, the connectors C1, C2, C11 and C12 are located close to one another, thus increasing the likelihood that the incorrect connector insertion has occurred. Further, when the first and second power supply circuit portions 35 and 36 are made to the same specifications as is the case with the foregoing embodiment, the specifications of the connectors C1 and C2 are also the same as those of the connectors C11 and C12, thus further increasing the likelihood that the incorrect connector insertion has occurred.

Hence, the electrically-driven vehicle drive apparatus designed as described thus far undergoes an abnormality determination process by use of a predetermined method for detecting incorrect connector insertion in the examination before shipping, for determinations whether or not the incorrect connector insertion has occurred between the connector C11 and the connector C11, between the connector C2 and the connector C12, and between the connector C4 and the connector C14, and also whether or not mechanical disconnection of the connector has occurred.

It can be assumed that the incorrect connector insertion has occurred between the connector C3 and the connector C13, between the connector C5 and the connector C15 and between the connector C6 and the connector C16. However, the description is omitted because the incorrect connector insertion occurred between the connector C3 and the connector C13 is in the same situation as that in the incorrect connector insertion occurred between the connector C11 and the connector C11, and similarly the incorrect connector insertion occurred between the connector C5 and the connector C15 is in the same situation as that in the incorrect connector insertion occurred between the connector C2 and the connector C12, and the incorrect connector insertion occurred between the connector C6 and the connector C16 is in the same situation as that in the incorrect connector insertion occurred between the connector C4 and the connector C14.

Figure 5:
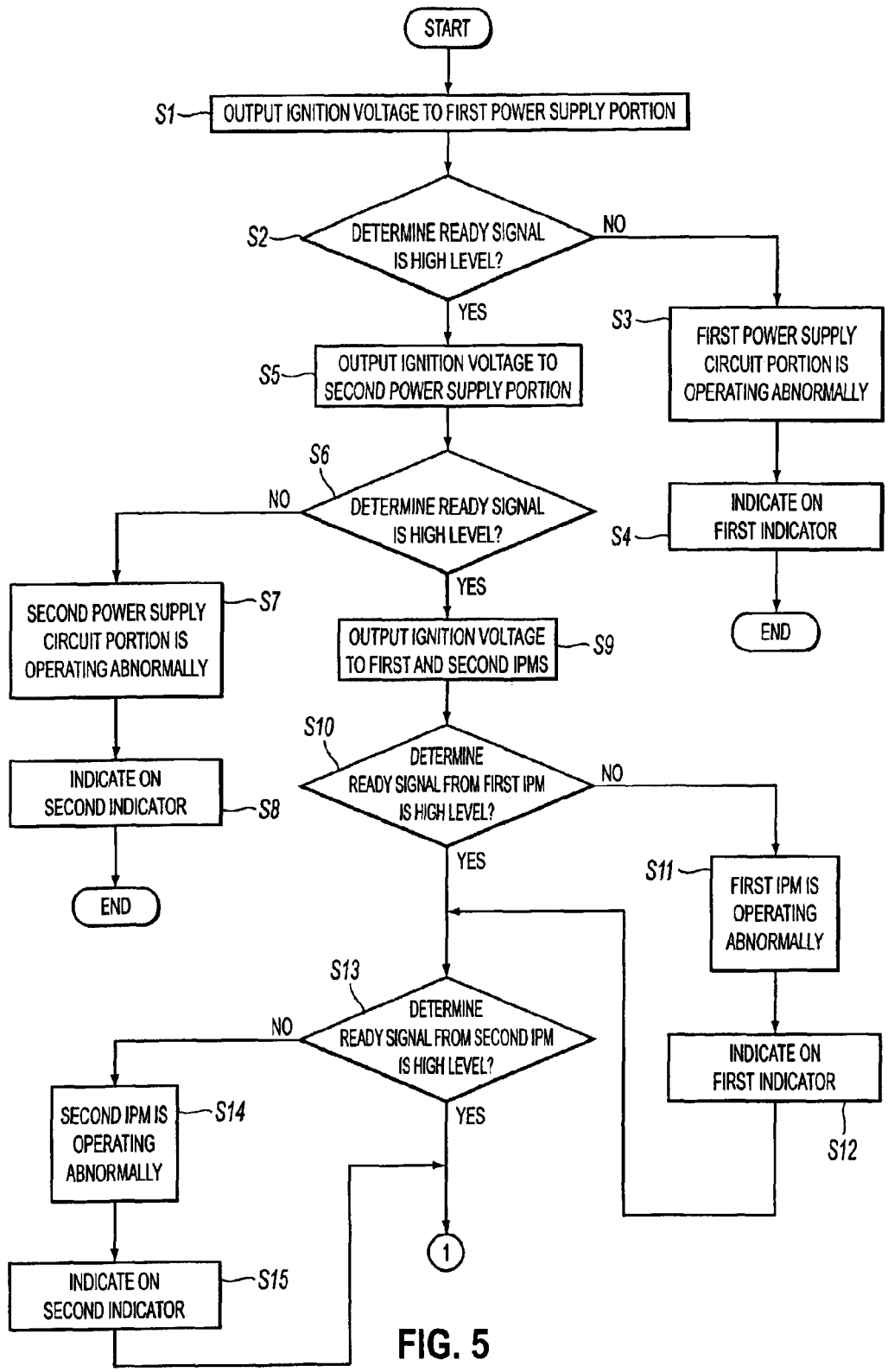
FIG. 5 is a first flow chart showing the operation in an abnormality determining process according to the exemplary embodiment of the invention.
Figure 6:
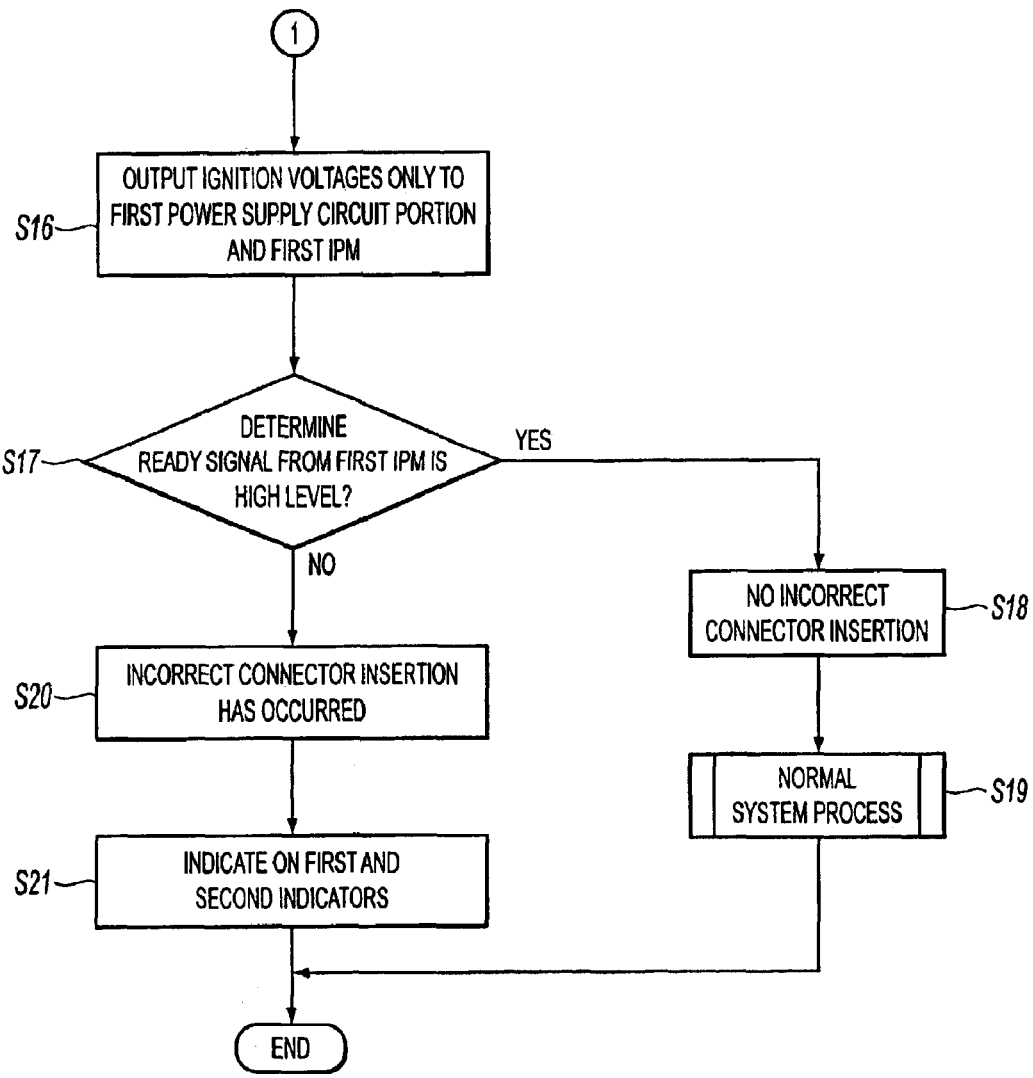
FIG. 6 is a second flow chart showing the operation in the abnormality determining process according to the exemplary embodiment of the invention.

FIG. 5 is a first flow chart showing the operation in a process of determining abnormality according to the embodiment of the invention. FIG. 6 is a second flow chart showing the operation in the abnormality determining process according to the embodiment of the invention.

In the case of FIGS. 5 and 6, first, the operator records test programs, data and the like into the drive motor control device 37 (see FIG. 3) and the generator control device 38. A first abnormality determination processing unit (not shown) of the drive motor control device 37 carries out a first abnormality determination process on the basis of the first program, data or the like to determine whether or not the first power supply circuit portion 35 and the first IPM 32 are operating abnormally. A second abnormality determination processing unit (not shown) of the generator control device 38 carries out a second abnormality determination process to determine whether or not the second power supply circuit portion 36 and the second IPM 33 are operating abnormally. The first abnormality determination processing unit further determines whether or not a incorrect connector insertion has occurred and the connector is mechanically disconnected.

After completion of the wiring of the first and second power supply circuit portions 35 and 36, the first and second IPM 32 and 33, the drive motor control device 37, and the generator control device 38, a test signal output processing unit 91 (see FIG. 1) of the first abnormality determination processing unit carries out a test signal output process to output an ignition voltage as a first test signal to the first power circuit portion 35. A first power-supply-circuit abnormality determination processing unit of the first abnormality determination processing unit carries out a first power-supply-circuit abnormality determination process to determine whether or not a Ready signal, which is sent from the first power supply circuit portion 35 in accordance with the outputting of the ignition voltage to the first power supply circuit portion 35, is high level. If the Ready signal from the first power supply circuit portion 35 is not high level (i.e. it is low level), the first abnormality determination processing unit determines that the first power supply circuit portion 35 is operating abnormally, and outputs a notice signal, representing that the first power supply circuit portion 35 is operating abnormally, to the first indicating portion 41 used to notify the operator that the first power supply circuit portion 35 is operating abnormally.

Next, the test signal output processing unit 91 of the second abnormality determination processing unit outputs an ignition voltage as a first test signal to the second power supply circuit portion 36. A second power-supply-circuit abnormality determination processing unit of the second abnormality determination processing unit carries out a second power-supply-circuit abnormality determination process to determine whether or not a Ready signal, which is sent from the second power circuit portion 36 in accordance with the outputting of the ignition voltage to the second power supply circuit portion 36, is high level. If the Ready signal from the second power supply circuit portion 36 is low level, the second abnormality determination processing unit determines that the second power supply circuit portion 36 is operating abnormally, and outputs a notice signal, representing that the second power supply circuit portion 36 is operating abnormally, to the second indicating portion 42 used to notify the operator that the second power supply circuit portion 36 is operating abnormally.

Then, while the ignition voltage is being output to each of the first and second power supply circuit portions 35 and 36, the test signal output processing unit 91 of the first abnormality determination processing unit further outputs an ignition voltage as a second test signal to each of the first and second IPMs 32 and 33. A first IPM abnormality determination processing unit of the first abnormality determination processing unit carries out a first IPM abnormality determination process to determine whether or not a Ready signal, which is sent as a first determination signal from the first IPM 32 in accordance with the outputting of the ignition voltage to the first IPM 32, is high level. If the Ready signal from the first IPM 32 is low level, the first abnormality determination processing unit determines that the first IPM 32 is operating abnormally, and outputs a notice signal, representing that the first IPM 32 is operating abnormally, to the first indicating portion 41 used to notify the operator that the first IPM 32 is operating abnormally.

Next, the test signal output processing unit 91 of the second abnormality determination processing unit outputs an ignition voltage as a second test signal to the second IPM 33. A second IPM abnormality determination processing unit of the second abnormality determination processing unit carries out a second IPM abnormality determination process to determine whether a Ready signal as a second determination signal sent from the second IPM 33 is high level. If the Ready signal from the second IPM 33 is low level, the second abnormality determination processing unit determines that the second IPM 33 is operating abnormally, and outputs a notice signal, representing that the second IPM 33 is operating abnormally, to the second indicating portion 42 used to notify the operator that the second IPM 33 is operating abnormally.

Next, a description is given of a connector-connected state determination process for determining the connected state of the connectors C1 to C6 and C11 to C16.

First, the test signal output processing unit 91 of the first abnormality determination processing unit carries out a test signal output process to output ignition voltages as the first and second test signals only to the first power supply circuit portion 35 and the first IPM 32. The connector-connected state determination processing unit 92 of the first abnormality determination processing unit carries out the connector-connected state determination process to determine, in addition to the determination results of the first and second IPM abnormality determination processes, whether or not a Ready signal, which is sent as the first determination signal from the first IPM 32 in accordance with the outputting of the ignition voltages to the first power supply circuit portion 35 and the first IPM 32, is high level. When the Ready signals from the first and second IPMs 32 and 33 are high level in the determination results of the first and second IPM abnormality determination processes, and also both of when the Ready signals from the first power supply circuit portion 35 and the first IPM 32 are high level, the connector-connected state determination processing unit 92 of the first abnormality determination processing unit determines that incorrect connector insertion is not occurred between the connector C1 and the connector C11, between the connector C2 and the connector C12, and even between the connector C4 and the connector C14.

Then, the operator manipulates an operating portion (not shown) to instruct the record of the predetermined program, data and the like so that each of normal system processing units (not shown) of the drive motor control device 37 and the generator control device 38 carries out a normal system process to record the program, data and the like in the recorder.

If at least one of the Ready signals sent from the first power supply circuit portion 35 and the first IPM 32 is low level, the connector-connected state determination processing unit 92 determines that incorrect connector insertion has occurred between the connector C1 and the connector C11, between the connector C2 and the connector C12, or between the connector C4 and the connector C14. Then, the connector-connected state determination processing unit 92 sends a notice signal, representing that the incorrect connector insertion has occurred, to the first and second indicating portions 41 and 42 used to notify the operator that the incorrect connector insertion has occurred.

If the incorrect connector insertion has occurred, the operator changes places between the connector C1 and the connector C11, between the connector C2 and the connector C12, or between the connector C4 and the connector C14, and then operates the first to third abnormality determination processing units to carry out the first to third abnormality determination processes again.

In the embodiment as described above, if the Ready signal is high level when the ignition voltage is output to the first power supply circuit portion 35, the first power supply circuit portion 35 is found in a normal condition, whereas if the Ready signal is low level, the first power supply circuit portion 35 is found in an abnormal condition. If the Ready signal is high level when the ignition voltage is output to the second power supply circuit portion 36, the second power supply circuit portion 36 is also found in a normal condition, whereas if the Ready signal is low level, the second power supply circuit portion 36 is found in an abnormal condition.

If each Ready signal is high level when the ignition voltages are output to the first power supply circuit portion 35 and the first IPM 32, the first IPM 32 is found in a normal condition, whereas if the Ready signal sent from the first IPM 32 is low level, the first IPM 32 is found in an abnormal condition. If each Ready signal is high level when the ignition voltages are output to the second power supply circuit portion 36 and the second IPM 33, the second IPM 33 is found in a normal condition, whereas if the Ready signal sent from the second IPM 33 is low level, the second IPM 33 is found in an abnormal condition.

Further, no incorrect connector insertion is found to be occurred if each Ready signal is high level when the ignition voltages are output to the first power supply circuit portion 35 and the first IPM 32, if each Ready signal is high level when the ignition voltages are output to the second power supply circuit portion 36 and the second IPM 33, and also if each Ready signal is high level when the ignition voltages are output only to the first power supply circuit portion 35 and the first IPM 32.

The incorrect connector insertion is found between the connector C1 and the connector C11, between the connector C2 and the connector C12, or between the connector 4 and connector 14, if each Ready signal is high level when the ignition voltages are output to the first power supply circuit portion 35 and the first IPM 32, if each Ready signal is high level when the ignition voltages are output to the second power supply circuit portion 36 and the second IPM 33, and also if at least one of the Ready signals is low level when the ignition voltages are output only to the first power supply circuit portion 35 and the first IPM 32.

Consequently, the system is prevented from being operated while having incorrect connector insertion, and also when an abnormality occurs in the first or second control circuit, the reliable detection of the abnormality is ensured. There is no need of creating differences in shape or color for the connectors C1 to C6 and C11 to C16, achieving a reduced cost of each of the connectors C1 to C6 and C11 to C16, resulting in cost reduction in the electrically-driven vehicle drive apparatus.

The following description is about the flow chart.

In step S1, an ignition voltage is output to the first power supply circuit portion 35.

In step S2, it is determined whether or not a Ready signal is high level. If the Ready signal is high level, the process proceeds to step S5. If it is not high level (i.e. low level), the process proceeds to step S3.

In step S3, the first power supply circuit portion 35 is operating abnormally.

In step S4, an abnormality in the first power supply circuit portion 35 is indicated on the first indicating portion 41 and then the process is finished.

In step S5, an ignition voltage is output to the second power supply circuit portion 36.

In step S6, it is determined whether or not a Ready signal is high level. If the Ready signal is high level, the process proceeds to step S9. If it is not high level (i.e. low level), the process proceeds to step S7.

In step S7, the second power supply circuit portion 36 is operating abnormally.

In step S8, an abnormality in the second power supply circuit portion 36 is indicated on the second indicating portion 42 and then the process is finished.

In step S9, ignition voltages are output to the first and second IPMs 32 and 33.

In step S10, it is determined whether or not a Ready signal from the first IPM 32 is high level. If the Ready signal from the IPM 32 is high level, the process proceeds to step S13. If it is not high level (i.e. low level), the process proceeds to step S11.

In step S11, the first IPM 32 is operating abnormally.

In step S12, an abnormality in the first IPM 32 is indicated on the first indicating portion 41.

In step S13, it is determined whether or not a Ready signal from the second IPM 33 is high level. If the Ready signal from the IPM 33 is high level, the process proceeds to step S16. If it is not high level (i.e. low level), the process proceeds to step S14.

In step S14, the second IPM 33 is operating abnormally.

In step S15, an abnormality in the second IPM 33 is indicated on the second indicating portion 42.

In step S16, ignition voltages are output only to the first power supply circuit portion 35 and the first IPM 32.

In step S17, it is determined whether or not a Ready signal from the first IPM 32 is high level. If the Ready signal from the first IPM 32 is high level, the process proceeds to step S18. If it is not high level (i.e. low level), the process proceeds to step S20.

In step S18, no incorrect connector insertion has occurred.

In step S19, the normal system process is carried out and then the process is finished.

In step S20, the incorrect connector insertion has occurred.

In step S21, the presence of the incorrect connector insertion is indicated on the first and second indicating portions 41 and 42, and then the process is finished.

The embodiment includes a first stage at which the ignition voltages are output to the first and second power supply circuit portions 35 and 36 and determination is made whether or not the Ready signal sent from each of the first and second power supply circuit portions 35 and 36 is high level, a second stage at which the ignition voltages are output to the first and second IPMs 32 and 33 and determination is made whether or not the Ready signal sent from each of the first and second IPMs 32 and 33 is high level, and a third stage at which the ignition voltages are output only to the first power supply circuit portion 35 and the first IPM 32 and determination is made whether or not the Ready signal sent from each of the first power supply circuit portions 35 and the first IPM 32 is high level. However, the first to third stages can be selectively changed in order.

In the embodiment, at the third stage the ignition voltages are output only to the first power supply circuit portion 35 and the first IPM 32 and the determination is made whether or not the Ready signal sent from each of the first power supply circuit portion 35 and the first IPM 32 is high level.

However, the ignition voltages may be output only to the second power supply circuit portion 36 and the second IPM 33 and determination may be made whether or not a Ready signal sent from each of the second power supply circuit portion 36 and the second IPM 33 is high level.

In the embodiment, the first and second determination signal outputting portions are respectively structured by the first and second IPMs 32 and 33. However, the first and second determination signal outputting portions may be respectively structured by the first and second power supply circuit portions 35 and 36. In this case, the first and second power circuit portions 35 and 36 respectively output predetermined first and second determination signals to the drive motor control device 37 and the generator control device 38, respectively.

If the incorrect connector insertion has occurred only between the connectors C1 and C11, if it has occurred only between the connectors C2 and C12, if it has occurred only between the connectors C4 and C14, or if it has occurred between the connectors C1 and C11, between the connectors C2 and C12 and also between the connectors C4 and C14, when the connector-connected state determination processing unit 92 of the first abnormality determination processing unit outputs the ignition voltages only to the first power supply circuit portion 35 and the first IPM 32 in the connector-connected-state determination process, at least one of the Ready signals from the first power supply circuit portion 35 and the first IPM 32 becomes low level.

However, if the incorrect connector insertion has occurred both between the connector C1 and the connector C11 and also between the connector C2 and the connector C12, when the ignition voltage is output only to the first power supply circuit portion 35 and the first IPM 32, both of the Ready signals from the first power supply circuit portion 35 and the first IPM 32 become high level. In this event, it is determined that no incorrect connector insertion has occurred either between the connector C1 and the connector C11, between the connectors C2 and C12 or between the connectors C4 and C14. However, the first and second power supply circuit portions 35 and 36 are made to the same specifications and the system is operating normally, thus causing no problem.

Likewise, if the incorrect connector insertion has occurred both between the connector C1 and the connector C11 and also between the connector C4 and the connector C14, when the ignition voltages are output only to the first power supply circuit portion 35 and the first IPM 32, both of the Ready signals from the first power supply circuit portion 35 and the first IPM 32 become high level. In this event, it is determined that no incorrect connector insertion has occurred between the connectors C1 and C11, between the connectors C2 and C12, and also between the connectors C4 and C14. However, the first and second IPMs 32 and 33 are made to the same specifications and the system is operating normally, thus causing no problems.

Further, if the incorrect connector insertion has occurred both between the connector C2 and the connector C12 and also between the connector C4 and the connector C14, when the ignition voltages are output only to the first power supply circuit portion 35 and the first IPM 32, both of the Ready signals from the first power supply circuit portion 35 and the first IPM 32 become high level. In this event, it is determined that no incorrect connector insertion has occurred between the connectors C1 and C11, between the connectors C2 and C12, and also between the connectors C4 and C14. However, the first and second IPMs 32 and 33 are made to the same specifications and the system is operating normally, thus causing no problems.

The invention is not limited to the aforementioned embodiment, and various modifications based on the purpose of the invention are possible, which are regarded as within the scope of the invention.

What is claimed is:

1. An apparatus for detecting incorrect connector insertion, comprising:
a first member including a first connector; a second member including a second connector; a test signal output processing unit that outputs a first test signal to the first member and the second member; a first determination signal outputting portion that outputs a first determination signal in accordance with outputting the first test signal to the first member; a second determination signal outputting portion that outputs a second determination signal in accordance with outputting the first test signal to the second member; and a connector-connected state determination processing unit that determines the connected state of the first connector and the second connector based on the first determination signal and the second determination signal.

2. The apparatus for detecting the incorrect connector insertion according to claim 1, wherein the connector-connected state determination processing unit selectively outputs a second test signal to the first and second determination signal outputting portions, the first determination signal is output in accordance with outputting of the first test signal to the first member and the second test signal to the first determination signal outputting portion, and the second determination signal is output in accordance with outputting of the first test signal to the second member and the second test signal to the second determination signal outputting portion.

3. The apparatus for detecting the incorrect connector insertion according to claim 2, wherein the connector-connected state determination processing unit determines that incorrect connector insertion has occurred if the first and second determination signals become active when the second test signal is output to the first and second determination signal outputting portions, and if a predetermined determination signal does not become active when the second test signal is output to one of the first and second determination signal outputting portions.

4. The apparatus for detecting the incorrect connector insertion according to claim 3, wherein the first member outputs a first output signal to the first determination signal outputting portion in accordance with outputting the first test signal to the first member, and the first determination signal outputting portion outputs the first determination signal in accordance with outputting the first output signal, and wherein the second member outputs a second output signal to the second determination signal outputting portion in accordance with outputting the second test signal to the second member, and the second determination signal outputting portion outputs the second determination signal in accordance with outputting the second output signal.

5. The apparatus for detecting the incorrect connector insertion according to claim 4, wherein each of the first and second determination signal outputting portions receive the second test signal output from the connector-connected state determination processing unit, and respectively output the first and second determination signals.

6. The apparatus for detecting the incorrect connector insertion according to claim 5, wherein the test signal output processing unit and the connector-connected state determination processing unit are provided in a third member.

7. The apparatus for detecting the incorrect connector insertion according to claim 5, wherein the first test signal and the second test signal are an ignition voltage.

8. The apparatus for detecting the incorrect connector insertion according to claim 5, wherein the first member is a first power supply circuit portion, and the second member is a second power supply circuit portion, wherein the first determination signal outputting portion is a first intelligent power module (IPM), and the second determination signal outputting portion is a second IPM, and wherein the first output signal is a voltage required to drive the first IPM, and the second output signal is a voltage required to drive the second IPM.

9. The apparatus for detecting the incorrect connector insertion according to claim 5, wherein the first determination signal outputting portion is provided in the first member, and the second determination signal outputting portion is provided in the second member.

10. The apparatus for detecting the incorrect connector insertion according to claim 1, wherein the connector-connected state determination processing unit determines that incorrect connector insertion has occurred if the first and second determination signals become active when the second test signal is output to the first and second determination signal outputting portions, and if a predetermined determination signal does not become active when the second test signal is output to one of the first and second determination signal outputting portions.

11. The apparatus for detecting the incorrect connector insertion according to claim 10, wherein the first member outputs a first output signal to the first determination signal outputting portion in accordance with outputting the first test signal to the first member, and the first determination signal outputting portion outputs the first determination signal in accordance with outputting the first output signal, and wherein the second member outputs a second output signal to the second determination signal outputting portion in accordance with outputting the second test signal to the second member, and the second determination signal outputting portion outputs the second determination signal in accordance with outputting the second output signal.

12. The apparatus for detecting the incorrect connector insertion according to claim 11, wherein each of the first and second determination signal outputting portions receive the second test signal output from the connector-connected state determination processing unit, and respectively output the first and second determination signals.

13. The apparatus for detecting the incorrect connector insertion according to claim 1, wherein the first member outputs a first output signal to the first determination signal outputting portion in accordance with outputting the first test signal to the first member, and the first determination signal outputting portion outputs the first determination signal in accordance with outputting the first output signal, and wherein the second member outputs a second output signal to the second determination signal outputting portion in accordance with outputting the second test signal to the second member, and the second determination signal outputting portion outputs the second determination signal in accordance with outputting the second output signal.

14. The apparatus for detecting the incorrect connector insertion according to claim 13, wherein each of the first and second determination signal outputting portions receive the second test signal output from the connector-connected state determination processing unit, and respectively output the first and second determination signals.

15. The apparatus for detecting the incorrect connector insertion according to claim 1, wherein each of the first and second determination signal outputting portions receive the second test signal output from the connector-connected state determination processing unit, and respectively output the first and second determination signals.

16. A method for detecting incorrect connector insertion, comprising:

outputting a first test signal to a first member having a first connector, and to a second member having a second connector; and determining a connected state of the first connector and the second connector based on a first determination signal outputted by a first determination signal outputting portion in accordance with outputting the first test signal to the first member, and on a second determination signal outputted by a second determination signal outputting portion in accordance with outputting the first test signal to the second member.

17. A program that provides instructions for detecting incorrect connector insertion, instructions, which when executed by a processor, cause the processor to perform operations comprising:

outputting a first test signal to a first member having a first connector, and to a second member having a second connector; and determining a connected state of the first connector and the second connector based on a first determination signal outputted by a first determination signal outputting portion in accordance with outputting the first test signal to the first member, and on a second determination signal outputted by a second determination signal outputting portion in accordance with outputting the first test signal to the second member.

18. An apparatus for detecting incorrect connector insertion, comprising:

a first member including a first connector;

a second member including a second connector;

a test signal output processing means for outputting a first test signal to the first member and the second member;

a first determination signal outputting means for outputting a first determination signal based on the first test signal output to the first member;

a second determination signal outputting means for outputting a second determination signal based on the first test signal output to the second member; and a connector-connected state determination processing means for determining the connected state of the first connector and the second connector based on the first determination signal and the second determination signal.

* * * * *